United States Patent
Hatem et al.

(10) Patent No.: US 8,012,843 B2
(45) Date of Patent: Sep. 6, 2011

(54) OPTIMIZED HALO OR POCKET COLD IMPLANTS

(75) Inventors: Christopher R. Hatem, Salisbury, MA (US); Benjamin Colombeau, Salem, MA (US); Thirumal Thanigaivelan, North Andover, MA (US); Kyu-Ha Shim, Andover, MA (US); Dennis Rodier, Francestown, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/851,141

(22) Filed: Aug. 5, 2010

(65) Prior Publication Data

US 2011/0033998 A1    Feb. 10, 2011

Related U.S. Application Data

(60) Provisional application No. 61/232,127, filed on Aug. 7, 2009.

(51) Int. Cl.
*H01L 21/331* (2006.01)
(52) U.S. Cl. ........ 438/373; 438/372; 438/506; 438/514; 438/519
(58) Field of Classification Search .......... 438/302–307, 438/369–373, 480, 505–506, 514–519, 527, 438/766
See application file for complete search history.

(56) References Cited

U.S. PATENT DOCUMENTS

| | | | |
|---|---|---|---|
| 5,244,820 A | | 9/1993 | Kamata et al. |
| 5,399,506 A | * | 3/1995 | Tsukamoto ................. 438/301 |
| 6,214,707 B1 | * | 4/2001 | Thakur et al. ................ 438/513 |
| 2003/0087503 A1 | * | 5/2003 | Sakaguchi et al. ........... 438/406 |
| 2006/0244080 A1 | | 11/2006 | Chen |
| 2008/0242066 A1 | | 10/2008 | Jacobson |
| 2010/0009506 A1 | | 1/2010 | Chang et al. |

FOREIGN PATENT DOCUMENTS

| | | |
|---|---|---|
| EP | 0510374 A1 | 10/1992 |
| WO | 2008020972 A2 | 2/2008 |
| WO | 2008042647 A2 | 4/2008 |

OTHER PUBLICATIONS

Yu, Bin, et al., "50nm Gate-Length CMOS Transistor with Super-Halo: Design, Process, and Reliability;" Electron Devices Meeting, 1999, IEDM Technical Digest, International; Washington DC, USA, Dec. 5-8, 1999, IEEE, Piscataway, NJ, Dec. 5, 1999, 653-656.

S.J. Pennycook & R.J. Culbertson, Transient Enhanced Diffusion in B+ and P+ Implanted Silicon, Mat. Res. Soc. Symp. Proc., 1987, pp. 379-384, vol. 74.

T. Sugiyama et al., Characterization of Metastable Defects in Hydrogen-Implanted N-Type Silicon, Eur, Phys. J. Appl. Phys., 2004, pp. 137-139, vol. 27.

* cited by examiner

*Primary Examiner* — Dung A. Le

(57) ABSTRACT

An improved method of performing pocket or halo implants is disclosed. The amount of damage and defects created by the halo implant degrades the performance of the semiconductor device, by increasing leakage current, decreasing the noise margin and increasing the minimum gate voltage. The halo or packet implant is performed at cold temperature, which decreases the damage caused to the crystalline structure and improves the amorphization of the crystal. The use of cold temperature also allows the use of lighter elements for the halo implant, such as boron or phosphorus.

19 Claims, 3 Drawing Sheets

US 8,012,843 B2

OPTIMIZED HALO OR POCKET COLD IMPLANTS

This application claims priority of U.S. Provisional Patent Application Ser. No. 61/232,127, filed Aug. 7, 2009, the disclosure of which is incorporated herein by reference in its entirety.

FIELD

This invention relates to ion implantation, and, more particularly, to implantation at temperatures to improve halo or pocket implants.

BACKGROUND

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Halo implantation is commonly used to suppress punch-through effects. This effect is when the depletion regions of a source and drain short each other under the influence of both the gate-substrate bias and source-drain bias. In one instance, the halo is formed by implanting under the gate at a 45° angle. A pocket implant likewise can suppress punch-through effects. Accordingly, there is a need in the art for an improved implantation method at temperatures that improve halo or pocket implants.

SUMMARY

An improved method of performing pocket or halo implants is disclosed. The amount of damage and defects created by the halo implant degrades the performance of the semiconductor device, by increasing leakage current, decreasing the noise margin and increasing the minimum gate voltage. The halo or packet implant is performed at cold temperature, which decreases the damage caused to the crystalline structure and improves the amorphization of the crystal. The use of cold temperature also allows the use of lighter elements for the halo implant, such as boron or phosphorus.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
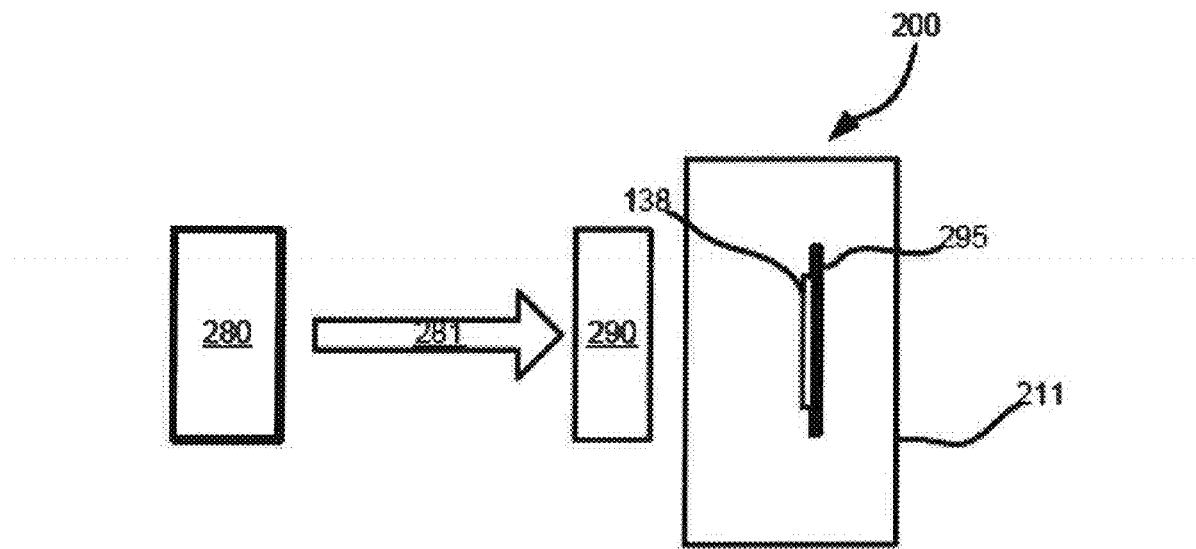
FIG. 1 is a simplified block diagram of a beam-line ion implanter.

FIG. 1 is a simplified block diagram of a beam-line ion implanter. Those skilled in the art will recognize that the beamline ion implanter 200 is only one of many examples of differing beamline ion implanters. In general, the beamline ion implanter 200 includes an ion source 280 to generate ions that are extracted to form an ion beam 281, which may be, for example, a ribbon beam or a spot beam. The ion beam 281 may be mass analyzed and converted from a diverging ion beam to a ribbon ion beam with substantially parallel ion trajectories in one instance. The beamline ion implanter 200 may further include an acceleration or deceleration unit 290 in some embodiments.

An end station 211 supports one or more workpieces, such as substrate 138, in the path of the ion beam 281 such that ions of the desired species are implanted into substrate 138. In one instance, the substrate 138 may be a semiconductor wafer having a disk shape, such as, in one embodiment, a 300 mm diameter silicon wafer. However, the substrate 138 is not limited to a silicon wafer. The substrate 138 could also be, for example, a flat panel, solar, or polymer substrate. The end station 211 may include a platen 295 to support the substrate 138. The end station 211 also may include a scanner (not shown) for moving the substrate 138 perpendicular to the long dimension of the ion beam 281 cross-section, thereby distributing ions over the entire surface of substrate 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 200 may incorporate hot or cold implantation of ions in some embodiments.

One skilled in the art will recognize other systems and processes involved in semiconductor manufacturing, other systems and processes involved in plasma treatment, or other systems and processes that use accelerated ions that may perform the process described herein. Some examples of this, for example, are a plasma doping tool, an ion shower, or a plasma immersion tool. Other semiconductor processing equipment known to those skilled in the art that can accelerate species and implant species into a substrate also may be used. Thus, this process is not limited solely to beam-line ion implanters.

Figure 2:
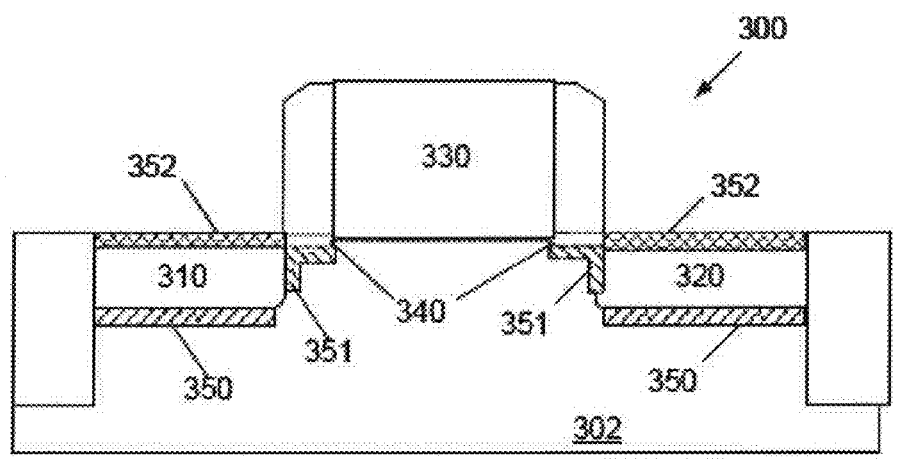
FIG. 2 is a cross-sectional view of a NMOS source-drain.

FIG. 2 is a cross-sectional view of a NMOS transistor 300. During an ion implantation step, the source 310 and drain 320 adjacent the gate 330 are doped with N-type dopants, such as atoms or molecule containing phosphorus or other group V elements. In some embodiments, to improve semiconductor performance, a source-drain extension (SDE) 340 is implanted. These implants are used to extend the source 310 and drain 320 beneath the gate 330. Implanting dopants into the source 310 or drain 320, however, will amorphize the crystal lattice of the substrate 302. Implantation also may cause defects to the crystal lattice.

There are several types of defects. Damage caused at the boundary between the bulk substrate and the amorphized portion is known as end-of-range (EOR) defects. These EOR defects may be located at the lower penetration range of the implanted ions, as represented by 350. The location of this EOR damage is typically parallel to the substrate surface, as the implant is typically performed in a direction perpendicular to the surface of the substrate. These EOR defects 350 may cause junction leakage. In addition, the use of an SDE implant may cause EOR damage that is located beneath the gate 330, as represented by 351. In some embodiments, since the SDE implant may be performed at an angle, the EOR damage caused by the SDE implant may be perpendicular to the substrate surface, or at least may not be parallel to the substrate surface. This damage may be referred to as lateral damage. Lateral diffusion may lead to short channel effects (SCE). Damage is also caused at the surface of the substrate, as represented by 352. While annealing the substrate after implantation may serve to cure and repair some of the damage caused, the anneal process cannot repair all of the damage. Each of these defects may cause problems with device performance. In some embodiments, this damage creates diagonally sloped downward channels within the substrate 302.

Figure 3:
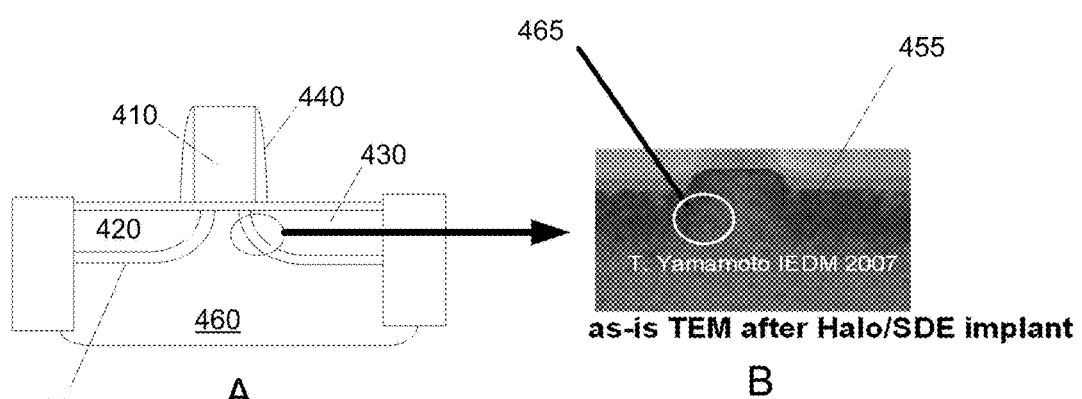
FIG. 3 is a cross-sectional view and TEM of a pocket implant.

As described above, lateral diffusion may cause short channel effects. This occurs when the length of the channel becomes similar in magnitude to the width of the channel. As gate lengths become shorter, this issue becomes more important. One method used to limit lateral diffusion is through the use of halo or pocket implants. FIG. 3A shows a cross-sectional view of a MOS device 400, with gate 410, source 420 and drain 430. On either side of gate 410 are spacers 440. Source 420 and drain 430 each extend beneath the gate 410, such as by employing a source drain extension (SDE). A halo or pocket implant 450 is an implant of dopant deposited beyond the drain 430 and source 420 regions, such as beneath the gate 410, which is the opposite conductivity of the associated source 420 and drain 430 regions. In other words, the halo implant 450 is of the same conductivity as the bulk substrate 460. The halo implant 450 creates a non-uniform channel doping profile. This halo implant reduces Vt roll-off in short channel devices. Also, higher $I_{dstat}$ is achieved, because at a particular threshold voltage Vt, the halo implant causes a more abrupt drain-channel junction and higher channel mobility.

To perform a halo or pocket implant 450, an implant energy greater than that used for the source 420 and drain 430 implants is typically used. This insures that the ions are deposited at a depth greater than the drain 430 and source 420. As described above, the conductivity of the dopants used for the halo or pocket implants 450 is opposite that used for the source 420 and drain 430 regions. Thus, if n-type dopants are used for the source 420 and drain 430 regions, p-type dopants are used for the halo or pocket implants 450. Furthermore, the halo or pocket implant 450 may be performed after the source 420 and drain 430 regions are implanted. In other embodiments, this implant 450 may be performed prior to the source 420 and drain 430 implants.

The halo or pocket implant 450 may be implanted by introducing an ion beam normal to the surface of the workpiece. In some embodiments, a tilted implant is performed to introduce dopants in the area beneath the gate 410. The tilt angle may be any angle, such as between 0° and 60°.

Implantation of dopants at cold temperature may be performed below the source 420 and drain 430 regions to form pockets or halos 450. The terms "cold temperature" or "low temperature" refer to temperatures below approximately 0° C. or, for example, between 0° C. and approximately −100° C. The dopants may be, for example, Group III or Group V elements, such as B, As, or P, in ionic atomic or molecular form. Thus, B ions may be implanted or carborane ions may be implanted. Performing this cold implant will enhance amorphization quality and reduce surface damage, lateral damage, and end of range (EOR) damage to the source and drain.

In a complementary metal-oxide-semiconductor (CMOS) device, bulk leakage may be reduced by performing a low-temperature halo or pocket implant. The low-temperature implant enhances amorphization, reduces the residual damage, and limits transient enhanced diffusion (TED) laterally. The reduction in lateral diffusion translates to an effective gate length increase. This increase will improve overlap capacitance ($C_{OV}$), threshold voltage ($V_t$), and drain induced barrier lowering (DIBL). DIBL also is improved by less lateral end of range (EOR) damage and leakage. The low-temperature implant also improves activation because there is less deactivation of the dopants due to less residual damage. More carriers are available which increases current (such as $T_{dstat}$) and, therefore, drive current is increased. External resistance also is improved because of the enhanced activation.

FIG. 3B is a TEM of a pocket implant. The dark region 455 is the amorphous region as a result of implant. The circled area 465 shows an inconsistent interface between amorphous and crystalline. In an ideal implant, there would be a smooth line between light and dark. This blotchy region 465 is an indication of defects. As illustrated in FIG. 3B, defects are present due to the implant.

A reduction in defects due to a cold implanted halo or packet implant has various benefits. For example, in a static random access memory (SRAM) device, there is an improvement in minimum operation voltage ($V_{ccmin}$). The reduced-temperature implant will reduce dopant segregation, or dopant diffusing out of the desired halo or pocket location due to excess damage. The reduced-temperature implant also will improve narrow gate width effect and, thus, will lower $V_{ccmin}$.

Figure 4:
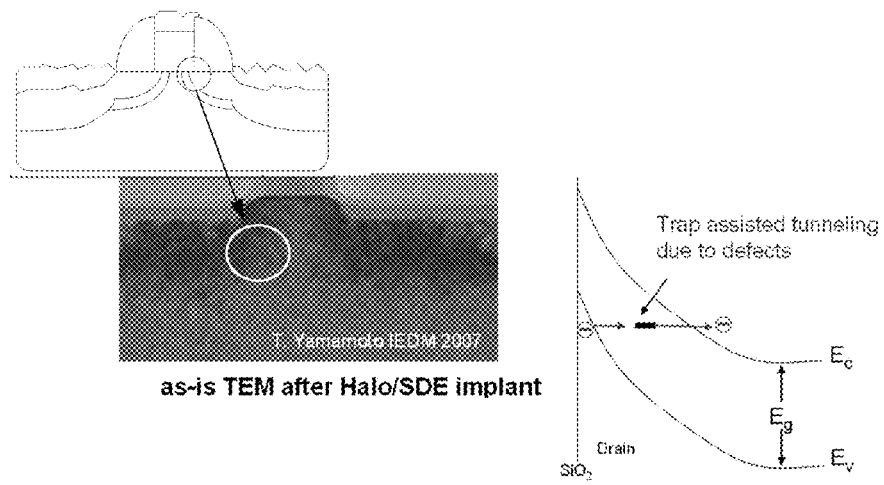
FIG. 4 is a cross-sectional view of a halo implant, TEM, and meta-stable region.

A lower-temperature implant also may change the type of damage from meta-stable implant damage to an amorphous implant damage. Meta-stable implant damage occurs in a transition region between the halo implant and the source and drain regions. Lower temperature implants allow the substrate to be fully amorphized at a low dose. FIG. 4 is a cross-sectional view of a halo implant, TEM, and meta-stable region. As seen in FIG. 4, the meta-stable region can cause traps. These traps exist at an energy level between the valance energy ($E_v$) and the conduction energy ($E_c$). Typically, electrons need to jump from the valence energy to the conduction energy to become mobile. The amount of energy needed to transition between these two bands is known as the bandgap energy ($E_g$). However, the presence of traps creates an intermediate energy level, which allows electrons to move more easily from the valance band to the conduction band. This phenomenom is known as trap assisted tunneling and adversely affects leakage current. By using a low-temperature implant, the implanted region is fully amorphized, which allows a defect-free implanted region after anneal. Most halo implant conditions are in the transition region, so amorphization needs to be enhanced so the implanted region can be recrystallized without introducing defects into the channel area. Low-temperature implants allow this enhanced amorphization.

Figure 5:
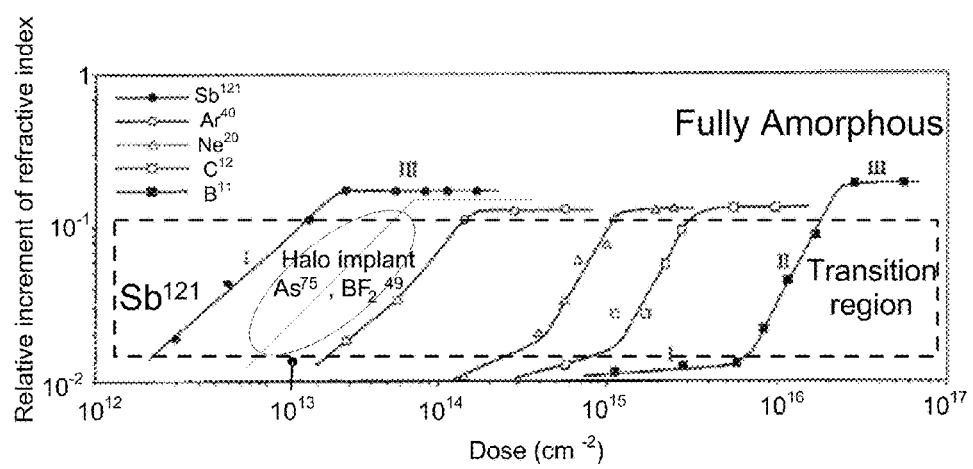
FIG. 5 is a graph comparing relative increment of refractive index to dose.

FIG. 5 is a graph comparing relative increment of refractive index to dose. Refractive index is a measure of the amorphization of a substrate. Note that the mass of the implanted species needed to fully amorphorize an implant decreases with increasing dose. In other words, at low dosage, such as those that used for halo and pocket implants, heavy species, such as antimony and arsenic, are required. However, at these low doses, even implants with heavier ions do not fully amorphize the substrate. For example, at a dose of 1e13, the substrate is in the transition region after an implant of arsenic. This transition region is not ideal because defects remain after anneal. Cold implant lowers the threshold of amorphization, creating a full amorphous region even at these low doses. Furthermore, by using cold-temperature implants, a lighter species, such as $BF_2$, B or P, may be used to achieve the same degree of amorphization. In addition, use of the heavier ions results in more amorphous regions. Thus, fewer defects remain after anneal.

In practice, the transistor is formed using traditional methods. The source and drain regions are implanted on opposite sides of a gate structure, using appropriate dopants. These dopants may be atomic or molecular ions having Group III and Group V elements, such as boron, phosphorus, or arsenic. This drain and source implant may be done at cold temperature, or normal temperatures, such as room temperature.

A second implant is also performed, at a depth deeper than the drain and source implants at cold temperature. This second implant is also performed using appropriate dopants, such as atomic or molecular ions having Group III and Group V elements, such as boron, phosphorus, or arsenic. As mentioned above, this implant is done using dopants having a conductivity opposite than of the source and drain implants. In some embodiments, at least a portion of the second implant may be performed using a tilt angle, such as between 0-60 degrees, so as to introduce dopants beneath the gate. In some embodiments, the source and drain regions are implanted at an implant energy of 1 keV to 5 keV and a dose of 1e14 to 2e15, while the second, or halo implant is performed at an implant energy of 0.5 keV to 200 keV and a dose of 1e12 to 1e15. Note that in some embodiments, the halo dose is less than the source and drain dose. Also, in some embodiments, the implant energy of the halo implant is greater than that of the source and drain implant (depending on the type of species used for each implant).

The source and drain implant may be done before or after the halo implant. Furthermore, an anneal cycle may follow the completion of both implant steps. In other embodiments, an anneal may be done between the two implant steps.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a substrate, comprising:
   introducing dopants of a first species into regions of said substrate adjacent to a gate, so as to create a source region and a drain region; and
   introducing dopants of a second species into regions beneath said source region and drain region, said second species being of opposite conductivity than said first species, wherein said second species is implanted at a cold temperature.

2. The method of claim 1, wherein said substrate is annealed following said introduction of said first and second species.

3. The method of claim 1, wherein said substrate is annealed between said introduction of said first and second species.

4. The method of claim 1, wherein said first species is an atomic or molecular ion comprising a Group III element, and said second species is an atomic or molecular ion comprising a Group V element.

5. The method of claim 1, wherein said first species is an atomic or molecular ion comprising a Group V element, and said second species is an atomic or molecular ion comprising a Group III element.

6. The method of claim 1, wherein the dose of said second species is less than the dose of said first species.

7. The method of claim 1, wherein said second species is implanted using a tilt angle.

8. The method of claim 7, wherein said tilt angle is between 0 and 60 degrees.

9. The method of claim 1, wherein said first species is implanted at cold temperature.

10. The method of claim 1, wherein said cold temperature is between 0° and −100° C.

11. The method of claim 9, wherein said cold temperature is between 0° and −100° C.

12. The method of claim 1, wherein said second species is implanted with an implant energy greater than said first species.

13. A method of processing a substrate, comprising:
    introducing dopants of a first species into regions of said substrate adjacent to a gate, so as to create a source region and a drain region; and
    introducing dopants of a second species into regions beneath said gate, said second species being of opposite conductivity than said first species, wherein said second species is implanted at a cold temperature.

14. The method of claim 13, wherein said second species is implanted using a tilt angle.

15. The method of claim 14, wherein said tilt angle is between 0 and 60 degrees.

16. The method of claim 13, wherein said first species is implanted at cold temperature.

17. The method of claim 13, wherein said cold temperature is between 0° and −100° C.

18. The method of claim 16, wherein said cold temperature is between 0° and −100° C.

19. The method of claim 13, wherein the dose of said second species is less than the dose of said first species.

* * * * *